United States Patent
Kawashima

(10) Patent No.: US 6,569,708 B2
(45) Date of Patent: May 27, 2003

(54) REPAIRABLE FLIP CHIP SEMICONDUCTOR DEVICE WITH EXCELLENT PACKAGING RELIABILITY AND METHOD OF MANUFACTURING SAME

(75) Inventor: Tomohiro Kawashima, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 89 days.

(21) Appl. No.: 09/847,607

(22) Filed: May 2, 2001

(65) Prior Publication Data

US 2001/0044198 A1 Nov. 22, 2001

(30) Foreign Application Priority Data

May 17, 2000 (JP) .......... 2000-145314

(51) Int. Cl.[7] .......... H01L 21/44; H01L 21/48; H01L 21/50
(52) U.S. Cl. .......... 438/108; 438/613
(58) Field of Search .......... 438/108, 613, 438/614, 612; 257/737, 780

(56) References Cited

U.S. PATENT DOCUMENTS

| | | | |
|---|---|---|---|
| 5,347,162 A | | 9/1994 | Pasch |
| 5,705,858 A | * | 1/1998 | Tsukamoto .......... 257/778 |
| 5,798,285 A | * | 8/1998 | Bentlage et al. .......... 438/108 |
| 5,897,336 A | * | 4/1999 | Brouillette et al. .......... 438/108 |
| 6,228,681 B1 | * | 5/2001 | Gilleo et al. .......... 438/108 |
| 2001/0040299 A1 | | 11/2001 | Moden |

FOREIGN PATENT DOCUMENTS

| | | |
|---|---|---|
| EP | 0 229 850 | 7/1987 |
| EP | 0 997 942 | 5/2000 |
| JP | 02-125633 | 5/1990 |
| JP | 11-307563 | 11/1999 |
| JP | 2000-040713 | 2/2000 |
| WO | 02/07218 | 1/2002 |

\* cited by examiner

Primary Examiner—Stephen D. Meier
Assistant Examiner—Khanh Duong
(74) Attorney, Agent, or Firm—Katten Muchin Zavis Rosenman

(57) ABSTRACT

First, there are prepared a semiconductor chip with a group of solder bumps disposed on and joined to a surface thereof in a predetermined pattern, and a multilayer plate including a second layer as an electrically conductive layer and first and third layers disposed on respective opposite surfaces of the second layer and comprising metal layers of one metal. Then, the first layer and the third layer of the multilayer plate are etched in a predetermined pattern to form a first group of posts and a second group of posts which have a pattern identical to the pattern of the group of solder bumps. Then, semiconductor chip is positioned to hold the solder bumps in contact with the posts of the first group, and the solder bumps are melted to join the solder bumps to the posts of the first group. Thereafter, the second layer is cut between the posts of the first and second groups, producing separate multilayer posts.

17 Claims, 5 Drawing Sheets

REPAIRABLE FLIP CHIP SEMICONDUCTOR DEVICE WITH EXCELLENT PACKAGING RELIABILITY AND METHOD OF MANUFACTURING SAME

BACKGROUND OF THE INVENTION

1. Field of the Invention

The present invention relates to a flip chip semiconductor device and a method of manufacturing such a flip chip semiconductor device.

2. Description of the Related Art

FIG. 1 of the accompanying drawings shows a process of mounting a conventional flip chip semiconductor device on a board. As shown in FIG. 1, flip chip semiconductor device 1 is placed on board 2, and then flip chip semiconductor device 1 and board 2 are joined to each other by solder bumps 3 that have been provided on flip chip semiconductor device 1. Then, the gap between flip chip semiconductor device 1 and board 2 is sealed by being filled up with resin 4. Resin 4 which has thus sealed the gap between flip chip semiconductor device 1 and board 2 is effective to prevent the packaging reliability from being reduced due to the difference between the coefficients of thermal expansion of board 2 and flip chip semiconductor device 1.

However, after the gap between flip chip semiconductor device 1 and board 2 has been sealed by resin 4, it is not easy to remove flip chip semiconductor device 1 from board 2. Therefore, when a certain fault occurs in the assembly, it is unavoidable to throw away flip chip semiconductor device 1 that is of a high added value even if flip chip semiconductor device 1 itself is not malfunctioning. Furthermore, when flip chip semiconductor device 1 suffers a failure, board 2 and other devices mounted thereon need to be discarded even if board 2 and other devices are not faulty.

SUMMARY OF THE INVENTION

It is an object of the present invention to provide a flip chip semiconductor device which can be mounted on a board so that it can easily be removed, without a reduction in the packaging reliability due to the difference between the coefficients of thermal expansion of the flip chip semiconductor device and the board, and a method of manufacturing such a flip chip semiconductor device.

To achieve the above object, a flip chip semiconductor device according to the present invention has a semiconductor chip, external solder electrodes, and an intermediate layer joined to and interposed between the semiconductor chip and the external solder electrodes. The external solder electrodes are arranged in a pattern identical to the pattern of solder bumps that are disposed on the semiconductor chip. The intermediate layer electrically connects the solder bumps to the external solder electrodes independently of each other.

The flip chip semiconductor device can be mounted on a desired board by melting the external solder electrodes. Stresses produced due to the difference between coefficients of thermal expansion between the board and the semiconductor chip can be absorbed by the intermediate layer. Therefore, the flip chip semiconductor is of excellent packaging reliability. Furthermore, the flip chip semiconductor that has been mounted on the board can easily be removed from the board for repair by melting the external solder electrodes.

In a method of manufacturing a flip chip semiconductor device according to a first embodiment of the present invention, a semiconductor chip and a multilayer plate, i.e., a three-layer plate, are prepared. The multilayer plate comprises a second layer as an electrically conductive layer and first and third layers disposed on respective opposite surfaces of the second layer and comprising metal layers of one metal, specifically copper.

The first layer of the multilayer plate is etched in a predetermined pattern to form a first group of posts which have a pattern identical to the pattern of a group of solder bumps on the semiconductor chip. Similarly, the third layer is etched in a predetermined pattern to form a second group of posts.

Then, the semiconductor chip is positioned to hold the solder bumps in contact with the posts of the first group, and the solder bumps are melted to join the solder bumps to the posts of the first group. The second layer is cut between the posts of the first and second groups. In particular, the second layer can be cut by mechanically applying a force to the second layer. In this manner, separate multilayer posts are produced which comprise the posts of the first group and the posts of the second group.

If necessary, a resin layer is formed in surrounding relation to the multilayer posts. The resin layer may be formed by preparing a film having a size equal to or greater than the semiconductor chip, positioning the film in abutment against the posts of the second group, filling and setting a resin in the gap between the semiconductor chip and the film, and removing the film.

If necessary, external solder electrodes are formed on the respective tip ends of the multilayer posts. In this fashion, there is manufactured a flip chip semiconductor device comprising a semiconductor chip, an intermediate layer including a group of multilayer posts disposed in and joined to a surface of the semiconductor chip in a predetermined pattern and a resin layer surrounding the multilayer posts, and external solder electrodes joined to the respective tip ends of the multilayer posts.

According to another embodiment, the second layer may comprise a solder layer. In this case, the second layer may be cut by heating the second layer.

In a method of manufacturing a flip chip semiconductor device according to a second embodiment of the present invention, a semiconductor chip and two metal plates are prepared.

The first metal plate is etched in a predetermined pattern to form a first group of posts in a pattern identical to the pattern of a group of solder bumps on the semiconductor chip. Specifically, the first metal plate is etched to a certain depth somewhere along its thickness according to a half-etching process. Similarly, the second metal plate is half-etched to form a second group of posts.

Then, solder layers are formed on the tip ends of the posts of the first group and/or the posts of the second group. The metal plates are matched to hold the posts of the first group and the posts of the second group in confronting relation to each other, and the solder layers are melted to join the metal plates to each other.

A first resin is filled and set in the gap between the metal plates, producing a first resin layer. Joints between the posts of each of the first and second groups of the metal plates are etched to produce a composite body which comprises separate multilayer posts and the first resin layer surrounding the multilayer posts.

Then, the semiconductor chip is positioned to hold the solder bumps in contact with the posts of the first group, and the solder bumps are melted and joined to the posts of the first group.

A second resin may then be filled and set in the gap between the semiconductor chip and the composite body, producing a second resin layer. If necessary, external solder electrodes are formed on the respective tip ends of the multilayer posts.

The above steps of the manufacturing methods may be combined to fabricate multilayer posts comprising an increased number of layers.

The above and other objects, features, and advantages of the present invention will become apparent from the following description with reference to the accompanying drawings which illustrate examples of the present invention.

DESCRIPTION OF THE PREFERRED EMBODIMENTS

FIGS. 2a through 2g show in sectional side elevation successive steps of a process of manufacturing a flip chip semiconductor device according to a first embodiment of the present invention. The process of manufacturing the flip chip semiconductor device according to the first embodiment will be described below with reference to FIGS. 2a through 2g.

Figure 1:
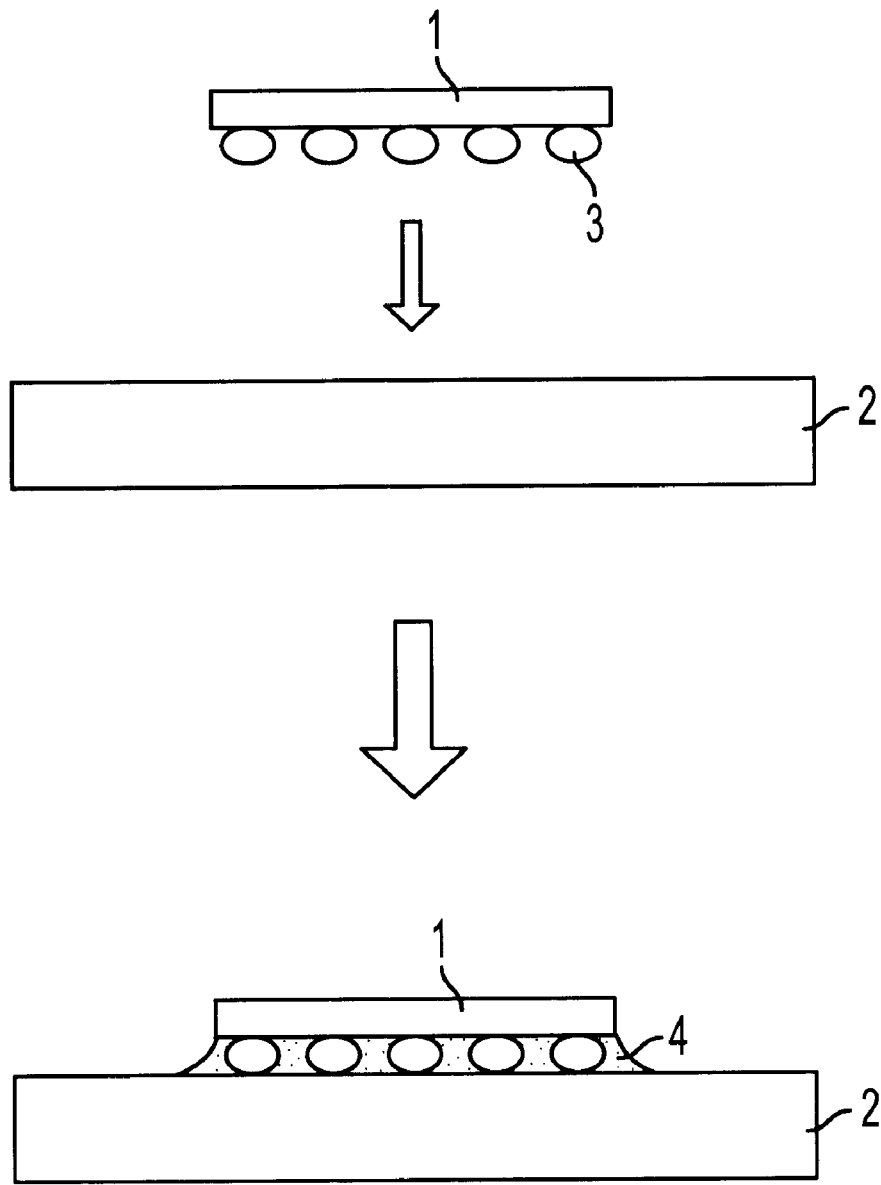
FIG. 1 is a view showing a process of installing a conventional flip chip semiconductor device on a board.
Figure 2A:
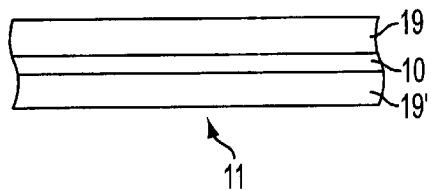
FIGS. 2a through 2g are sectional side elevational views showing successive steps of a process of manufacturing a flip chip semiconductor device according to a first embodiment of the present invention.

As shown in FIG. 2a, multilayer plate 11 of a three-layer structure is prepared which comprises copper plate 19, solder layer 10, and copper plate 19'.

Figure 2E:
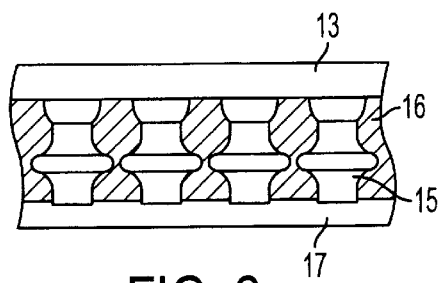
Figure 2B:
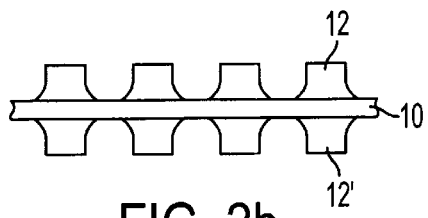

Then, as shown in FIG. 2b, copper plates 19, 19' that are disposed on respective opposite surfaces of multilayer plate 11 are etched in a predetermined pattern, forming copper posts 12, 12'. The patterns of copper posts 12, 12' on the opposite surfaces of multilayer plate 11 are identical to each other such that copper posts 12, 12' in corresponding pairs on the opposite surfaces of multilayer plate 11 are coaxial with each other.

Figure 2F:
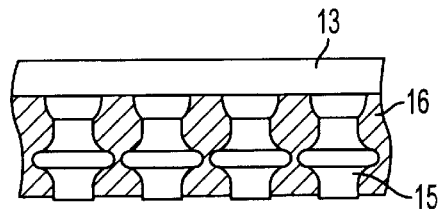
Figure 2C:
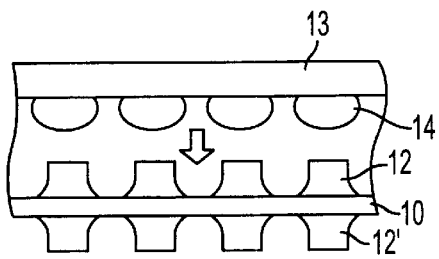

Thereafter, as shown in FIG. 2c, semiconductor chip 13 with solder bumps 14 disposed on one side thereof in a predetermined pattern is prepared. The patterns of copper posts 12, 12' are identical to the pattern of solder bumps 14. Specifically, copper posts 12, 12' are patterned so as to be able to position semiconductor chip 13 such that solder bumps 14 are coaxial with respective corresponding pairs of copper posts 12, 12'. Semiconductor chip 13 thus positioned is placed on copper posts 12 on one side of solder layer 10.

Figure 2G:
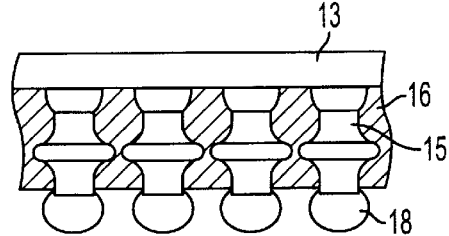
Figure 2D:
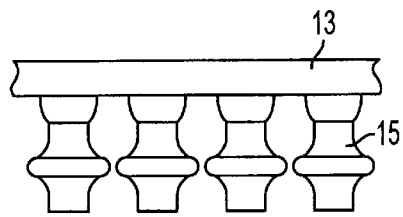

Then, as shown in FIG. 2d, while semiconductor chip 13 and copper posts 12 are being positionally aligned with each other, copper posts 12 and semiconductor chip 13 are heated to join solder bumps 14 and copper posts 12 to each other. Solder layer 10 is melted and attracted to copper posts 12, 12', and hence is separated into masses around copper posts 12, 12', thus producing multilayer posts 15 that are electrically separate from each other.

Then, as shown in FIG. 2e, elastic film 17 is brought into abutment against multilayer posts 15 such that elastic film 17 contacts the tip ends of multilayer posts 15. The gap between semiconductor chip 13 and elastic film 17 is then filled up with a resin, producing resin layer 16 in the gap.

Then, as shown in FIG. 2f, resin layer 16 is set, and thereafter elastic film 17 is removed, thereby producing a structure in which multilayer posts 15 are surrounded by resin layer 16.

Then, as shown in FIG. 2g, external solder electrodes 18 are formed, if necessary, on the respective tip ends of multilayer posts 15 by a solder ball mounting process or a solder paste printing process.

The flip chip semiconductor device according to the first embodiment is fabricated according to the above manufacturing process. The flip chip semiconductor thus fabricated can be installed on a desired board by melting external solder electrodes 18. When the flip chip semiconductor is on the board, stresses produced due to the difference between coefficients of thermal expansion between the board and semiconductor 13 are absorbed by multilayer posts 15 and resin layer 16. Therefore, the flip chip semiconductor is of excellent packaging reliability. Furthermore, the flip chip semiconductor that has been mounted on the board can easily be removed from the board by melting external solder electrodes 18.

FIGS. 3a through 3g show in sectional side elevation successive steps of a process of manufacturing a flip chip semiconductor device according to a second embodiment of the present invention. The process of manufacturing the flip chip semiconductor device according to the second embodiment will be described below with reference to FIGS. 3a through 3g.

Figure 3A:
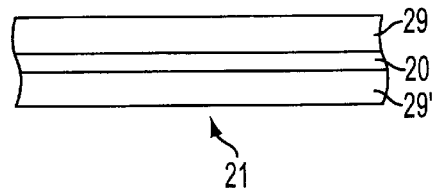
FIGS. 3a through 3g are sectional side elevational views showing successive steps of a process of manufacturing a flip chip semiconductor device according to a second embodiment of the present invention.

As shown in FIG. 3a, multilayer plate 21 of a three-layer structure is prepared which comprises copper plate 29, electrically conductive layer 20, and copper plate 29'.

Figure 3B:
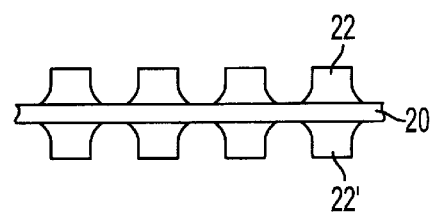

Then, as shown in FIG. 3b, copper plates 29, 29' that are disposed on respective opposite surfaces of multilayer plate 21 are etched in a predetermined pattern, forming copper posts 22, 22'. The patterns of copper posts 22, 22' on the opposite surfaces of multilayer plate 21 are identical to each other such that copper posts 22, 22' in corresponding pairs on the opposite surfaces of multilayer plate 21 are coaxial with each other. Electrically conductive layer 20 that is positioned intermediate between etched copper plates 29, 29' is made of a material that is almost completely resistant to erosion by the etching of copper plates 29, 29'.

Figure 3E:
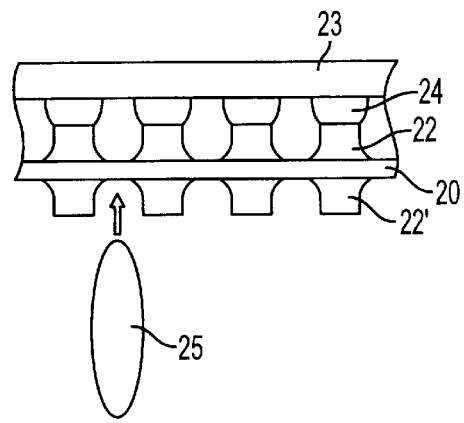
Figure 3C:
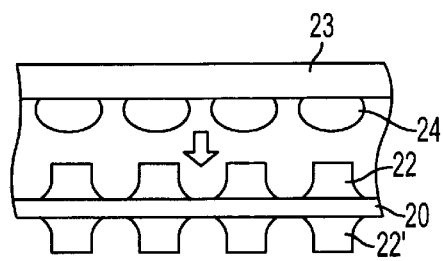

Thereafter, as shown in FIG. 3c, semiconductor chip 23 with solder bumps 24 disposed on one side thereof in a predetermined pattern is prepared. The patterns of copper posts 22, 22' are identical to the pattern of solder bumps 24. Specifically, copper posts 22, 22' are patterned so as to be able to position semiconductor chip 23 such that solder bumps 24 are coaxial with respective corresponding pairs of copper posts 22, 22'. Semiconductor chip 23 thus positioned is placed on copper posts 22 on one side of electrically conductive layer 20.

Figure 3F:
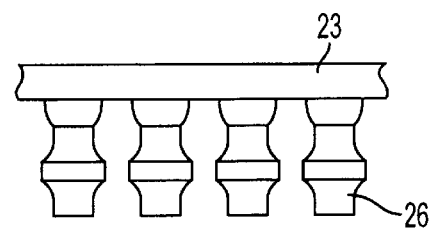
Figure 3D:
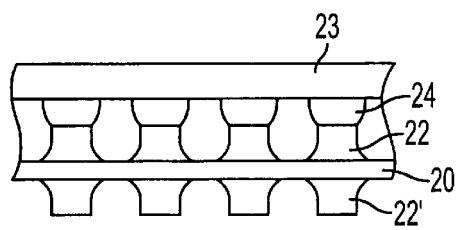

Then, as shown in FIG. 3d, while semiconductor chip 23 and copper posts 22 are being positionally aligned with each other, copper posts 22 and semiconductor chip 23 are heated to join solder bumps 24 and copper posts 22 to each other.

Then, as shown in FIG. 3e, dicing saw 25 for mechanically cutting electrically conductive layer 20 is prepared. Electrically conductive layer 20 is then cut by dicing saw 25, according to a dicing process, into portions joined to copper posts 22, 22', thereby, as shown in FIG. 3f, producing multilayer posts 26.

Figure 3G:
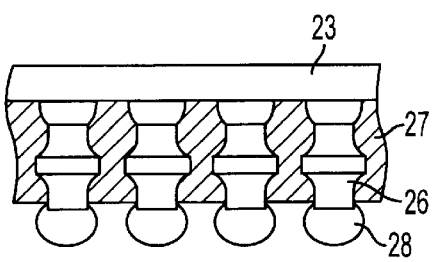

Then, as with the first embodiment, as shown in FIG. 3g, a resin layer 27 may be produced in surrounding relation to multilayer posts 15, and external solder electrodes 28 may be formed which are joined to the tip ends of multilayer posts 26.

The flip chip semiconductor device according to the second embodiment is fabricated according to the above manufacturing process. The flip chip semiconductor thus fabricated is of excellent packaging reliability. Furthermore, the flip chip semiconductor that has been mounted on a board can easily be removed from the board by melting external solder electrodes 28.

FIGS. 4a through 4h show in sectional side elevation successive steps of a process of manufacturing a flip chip semiconductor device according to a third embodiment of the present invention. The process of manufacturing the flip chip semiconductor device according to the third embodiment will be described below with reference to FIGS. 4a through 4h.

Figure 4A:
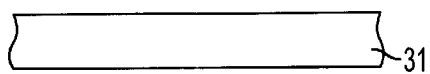
FIGS. 4a through 4h are sectional side elevational views showing successive steps of a process of manufacturing a flip chip semiconductor device according to a third embodiment of the present invention.
Figure 4B:
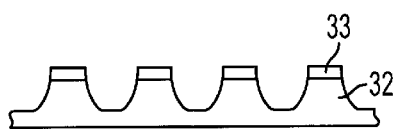

As shown in FIG. 4a, copper plate 31 is prepared. Then, as shown in FIG. 4b, one surface of copper plate 31 is etched to produce copper posts 32 in a predetermined pattern. Specifically, copper plate 31 is etched to a certain depth somewhere along its thickness according to a half-etching process. Then, solder layer 33 is formed on upper surfaces of copper posts 32 by a plating process or the like.

Figure 4C:
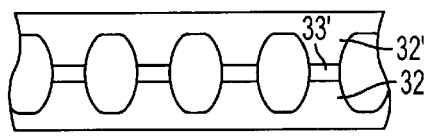

The steps shown in FIGS. 4a and 4b are repeated to form copper posts 32' on another copper plate. At this time, copper posts 32' are positioned such that copper posts 32, 32' will be coaxially aligned with each other when the copper plates with copper posts 32, 32' are combined with each other to bring copper posts 32, 32' into matching relation to each other. Then, the two copper plates are combined to hold solder layers 33 on the tip ends of copper posts 32, 32' into abutment against each other. Then, solder layers 33 are heated and melted, thus joining copper posts 32, 32' with solder layers 33', as shown in FIG. 4c.

Figure 4D:
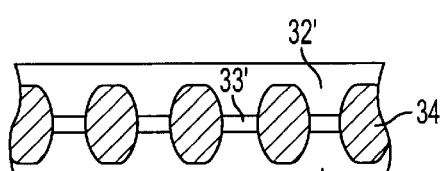

Then, as shown in FIG. 4d, the gap between the copper plates thus joined to each other is filled with a first resin around joined copper posts 32, 32', producing first resin layer 34 between the copper plates.

Figure 4E:
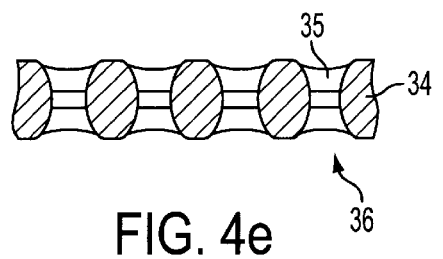

Then, as shown in FIG. 4e, the opposite copper surfaces of the joined assembly are etched away, leaving the copper posts 32, 32' as separate multilayer posts 35. In this manner, a composite body 36 composed of multilayer posts 35 and first resin layer 34 surrounding multilayer posts 35 is obtained.

Figure 4F:
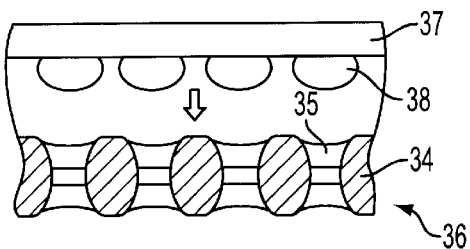

Thereafter, as shown in FIG. 4f, semiconductor chip 37 with solder bumps 38 disposed on one side thereof in a predetermined pattern is prepared. The pattern of multilayer posts 35 is identical to the pattern of solder bumps 38. Specifically, multilayer posts 35 are patterned so as to be able to position semiconductor chip 37 such that solder bumps 38 are coaxial with respective corresponding multilayer posts 35. Semiconductor chip 37 thus positioned is placed on composite body 36.

Figure 4G:
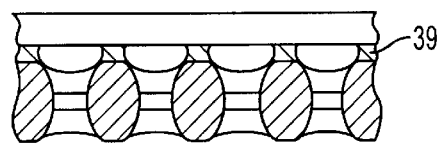

Then, as shown in FIG. 4g, while semiconductor chip 37 and composite body 36 are being positionally aligned with each other, the assembly is heated to melt solder bumps 38 thereby to join semiconductor chip 37 and multilayer posts 35 with solder bumps 38. Then, a second resin is poured into the gap between semiconductor chip 37 and composite body 36, producing second resin layer 39 in the gap.

Figure 4H:
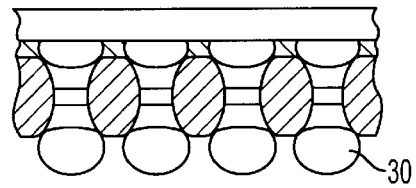

Then, as shown in FIG. 4h, external solder electrodes 30 are formed, if necessary, on the respective tip ends of multilayer posts 35 by a solder ball mounting process or a solder paste printing process.

The flip chip semiconductor device according to the third embodiment is fabricated according to the above manufacturing process. The flip chip semiconductor thus fabricated is of excellent packaging reliability. Furthermore, the flip chip semiconductor that has been mounted on a board can easily be removed from the board by melting external solder electrodes 30.

Figure 5:
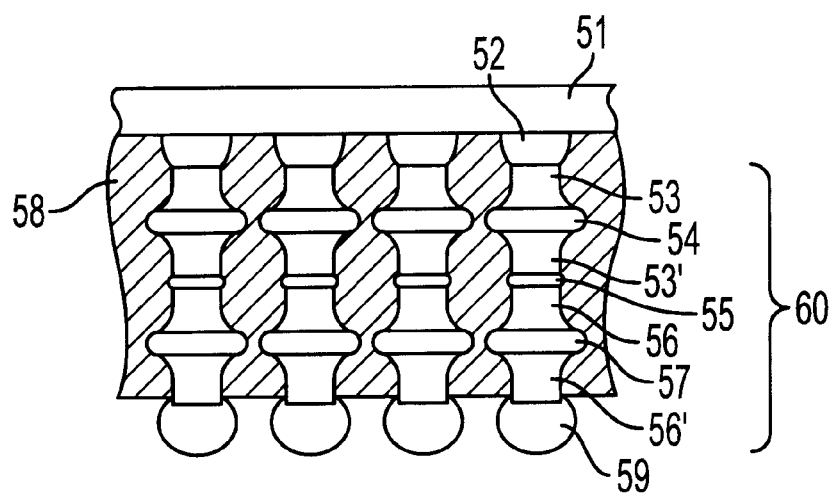
FIG. 5 is a sectional side elevational view of a flip chip semiconductor device according to a modification of the present invention.
Figure 6:
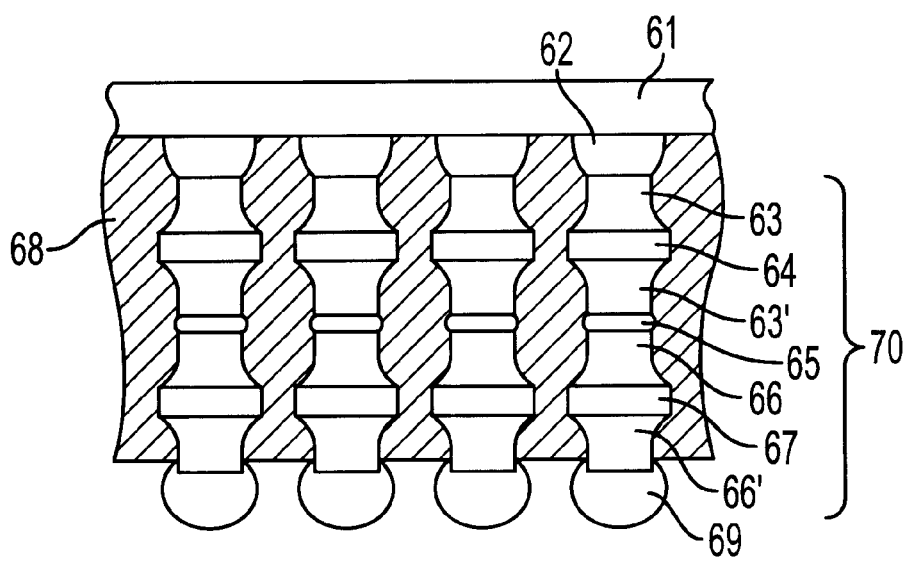
FIG. 6 is a sectional side elevational view of a flip chip semiconductor device according to another modification of the present invention.

The above steps of the processes for manufacturing the flip chip semiconductor devices according to the first through third embodiments may be combined to fabricate other flip chip semiconductor devices, e.g., multilayer flip chip semiconductor devices shown in FIGS. 5 and 6.

The multilayer flip chip semiconductor device shown in FIG. 5 may be fabricated as follows:

The steps shown in FIGS. 2a and 2b are carried out twice to produce a structure in which copper posts 53, 53' are joined to each other by solder layers 54 and a structure in which a copper posts 56, 56' are joined to each other by solder layers 57. Then, plated solder layers 55 are formed on the tip ends of copper posts 53'.

These structures and semiconductor chip 51 with solder bumps 52 disposed thereon are brought into abutment against each other such that solder bumps 52 and copper posts 53, 53', 56, 56' are positioned in coaxial alignment with each other. The assembly is then heated to melt solder bumps 52 and plated solder layers 55 to join semiconductor chip 51 and the structures together. At this time, solder layers 54 between copper posts 53, 53' are melted and attracted to copper posts 53, 53', and solder layers 57 between copper posts 56, 56' are melted and attracted to copper posts 56, 56', thus producing separate multilayer posts 60.

Subsequently, the steps shown in FIGS. 2e through 2g may be carried out to form resin layer 58 surrounding multilayer posts 60 and external solder electrodes 59 joined to the tip ends of multilayer posts 60.

The multilayer flip chip semiconductor device shown in FIG. 6 may be fabricated as follows:

The steps shown in FIGS. 3a through 3f are carried out to join copper posts 63, electrically conductive layer 64, and copper posts 63' to solder bumps 62 that are disposed on semiconductor chip 61. Then, plated solder layers 65 are formed on the tip ends of copper posts 63'.

Then, the steps shown in FIGS. 3a and 3b are carried out to produce a structure which comprises electrically conductive layer 67 and copper posts 66, 66' joined to each other by electrically conductive layer 67. With copper posts 66 held against plated solder layers 65, the assembly is heated to melt plated solder layers 65 to join copper posts 63', 66. The step shown in FIG. 3e is carried out to mechanically cut electrically conductive layer 67, producing separate multilayer posts 70.

Subsequently, the steps shown in FIGS. 2e through 2g may be carried out to form resin layer 68 surrounding multilayer posts 70 and external solder electrodes 69 joined to the tip ends of multilayer posts 70.

While preferred embodiments of the present invention have been described using specific terms, such description is for illustrative purposes only, and it is to be understood that changes and variations may be made without departing from the spirit or scope of the following claims.

What is claimed is:

1. A method of manufacturing a flip chip semiconductor device, comprising the steps of:
   preparing a semiconductor chip with a group of solder bumps disposed on and joined to a surface thereof in a predetermined pattern, and a multilayer plate including a second layer as an electrically conductive layer and first and third layers disposed on respective opposite surfaces of said second layer and comprising metal layers of one metal;
   etching said first layer and said third layer of said multilayer plate in a predetermined pattern depending on the pattern of said group of solder bumps to form a first group of posts and a second group of posts which have a pattern identical to the pattern of said group of solder bumps;
   positioning said semiconductor chip to hold said solder bumps in contact with the posts of said first group, and melting said solder bumps to join the solder bumps to the posts of said first group; and
   cutting said second layer between the posts of the first and second groups to form a group of electrically conductive layers, producing separate multilayer posts which comprise the posts of said first group, the electrically conductive layers, and the posts of said second group.

2. A method according to claim 1, wherein said one metal comprises copper.

3. A method according to claim 1, wherein said step of cutting said second layer comprises the step of:
   mechanically applying a force to said second layer.

4. A method according to claim 1, wherein said second layer comprises a solder layer.

5. A method according to claim 4, wherein said step of cutting said second layer comprises the step of:
   heating said second layer.

6. A method according to claim 1, further comprising the steps of:
   preparing a film having a size equal to or greater than said semiconductor chip; and
   positioning said film in abutment against the posts of said second group, filling and setting a resin in the gap between said semiconductor chip and said film, and removing said film to form a resin layer in surrounding relation to said multilayer posts.

7. A method according to claim 1, further comprising the step of:
   forming external solder electrodes on the respective tip ends of said multilayer posts.

8. A method of manufacturing a flip chip semiconductor device, comprising the steps of:
   preparing a semiconductor chip with a group of solder bumps disposed on and joined to a surface thereof in a predetermined pattern, and two metal plates;
   half-etching each of said two metal plates in a predetermined pattern depending on the pattern of said group of solder bumps to form a first group of posts and a second group of posts which have a pattern identical to the pattern of said group of solder bumps;
   forming solder layers on the tip ends of the posts of said first group and/or the posts of said second group;
   matching said metal plates to hold the posts of said first group and the posts of said second group in confronting relation to each other, and melting said solder layers to join the metal plates to each other;
   filling and setting a first resin in the gap between said metal plates to form a first resin layer;
   etching joints between the posts of each of the first and second groups of said metal plates to produce a composite body which comprises separate multilayer posts comprising the posts of said first group, said solder layers, and the posts of said second group, and said first resin layer surrounding said multilayer posts;
   positioning said semiconductor chip to hold said solder bumps in contact with the posts of said first group, and melting said solder bumps to join the solder bumps to the posts of said first group.

9. A method according to claim 8, further comprising the step of:
   filling and setting a second resin in the gap between said semiconductor chip and said composite body to form a second resin layer.

10. A method according to claim 8, further comprising the step of:
    forming external solder electrodes on the respective tip ends of said multilayer posts.

11. A method of manufacturing a flip chip semiconductor device, comprising the steps of:
    preparing a semiconductor chip with a group of solder bumps disposed on and joined to a surface thereof in a predetermined pattern, a first multilayer plate including a second layer as an electrically conductive layer and first and third layers disposed on respective opposite surfaces of said second layer and comprising metal layers of one metal, and a second multilayer plate including a fifth layer as an electrically conductive layer and fourth and sixth layers disposed on respective opposite surfaces of said fifth layer and comprising metal layers of one metal;
    etching said first layer and said third layer of said first multilayer plate in a predetermined pattern depending on the pattern of said group of solder bumps to form a first group of posts and a second group of posts which have a pattern identical to the pattern of said group of solder bumps;
    etching said fourth layer and said sixth layer of said second multilayer plate in a predetermined pattern depending on the pattern of said group of solder bumps to form a third group of posts and a fourth group of posts which have a pattern identical to the pattern of said group of solder bumps;
    forming plated solder layers on the respective tip ends of the posts of said second group;
    positioning said first multilayer plate and said second multilayer plate to hold the posts of said second group and the posts of said third group in confronting relation to each other, and melting said plated solder layers to join the posts of said second group and the posts of said third group to each other;
    positioning said semiconductor chip to hold said solder bumps in contact with the posts of said first group, and melting said solder bumps to join the solder bumps to the posts of said first group; and
    cutting said second layer between the posts of the first and second groups to form a first group of electrically conductive layers, cutting said fifth layer between the posts of the third and fourth groups to form a second group of electrically conductive layers, producing separate multilayer posts which comprise the posts of said first group, the electrically conductive layers of said first group, the posts of said second group, said plated solder layers, the posts of said third group, the electrically conductive layers of said second group, and the posts of said fourth group.

12. A method according to claim 11, wherein the metal of said first layer, said third layer, said fourth layer, and said sixth layer comprises copper.

13. A method according to claim 11, wherein said step of cutting said second layer and said fifth layer comprises the step of:

mechanically applying a force to said second layer and said fifth layer.

14. A method according to claim 11, wherein said second layer and/or said fifth layer comprises a solder layer.

15. A method according to claim 14, wherein said solder layer is cut by heating the solder layer.

16. A method according to claim 11, further comprising the steps of:

preparing a film having a size equal to or greater than said semiconductor chip; and positioning said film in abutment against the posts of said fourth group, filling and setting a resin in the gap between said semiconductor chip and said film, and removing said film to form a resin layer in surrounding relation to said multilayer posts.

17. A method according to claim 11, further comprising the step of:

forming external solder electrodes on the respective tip ends of said multilayer posts.

* * * * *